(12) United States Patent  
Kokura et al.

(10) Patent No.: US 7,029,727 B1
(45) Date of Patent: Apr. 18, 2006

(54) PATTERNED SUBSTRATE AND LIQUID CRYSTAL DISPLAY PROVIDED THEREWITH

(75) Inventors: Masafumi Kokura, Kashiba (JP); Yoshiharu Kataoka, Suita (JP); Takayuki Shimada, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 145 days.

(21) Appl. No.: 09/696,220

(22) Filed: Oct. 26, 2000

(30) Foreign Application Priority Data

Oct. 26, 1999 (JP) ............................. 11-303823
Aug. 28, 2000 (JP) ............................. 2000-257232

(51) Int. Cl.
*C09K 19/00* (2006.01)
*G02F 1/133* (2006.01)
*G02F 1/136* (2006.01)

(52) U.S. Cl. .............. 428/1.1; 428/1.5; 428/1.51; 428/1.6; 428/1.62; 428/457; 428/698; 349/19; 349/33; 349/41; 349/42

(58) Field of Classification Search .......... 428/1.1, 428/1.5, 1.51, 1.6, 1.62, 698, 457; 257/52, 257/57, 49; 349/42, 19, 33, 41, 43, 46
See application file for complete search history.

(56) References Cited

U.S. PATENT DOCUMENTS

| | | | | |
|---|---|---|---|---|
| 5,093,711 A | * | 3/1992 | Hirakawa | 357/71 |
| 5,408,345 A | * | 4/1995 | Mitsui et al. | 349/42 |
| 5,430,320 A | * | 7/1995 | Lee | 257/412 |
| 5,831,281 A | * | 11/1998 | Kurogane et al. | 257/57 |
| 6,043,859 A | * | 3/2000 | Maeda | 349/143 |
| 2002/0047947 A1 | | 4/2002 | Hur et al. | 349/42 |

FOREIGN PATENT DOCUMENTS

| | | |
|---|---|---|
| JP | 6-75238 | 3/1994 |
| JP | 9-148586 | 6/1997 |
| JP | 11-258625 | 9/1999 |

* cited by examiner

*Primary Examiner*—Harold Pyon
*Assistant Examiner*—Walter B Aughenbaugh
(74) *Attorney, Agent, or Firm*—Nixon & Vanderhye P.C.

(57) ABSTRACT

A thin film transistor (TFT) is formed on an insulating substrate, and a photosensitive resin film as an interlayer insulating film is formed so as to cover the TFT. Contact holes are formed in the photosensitive resin, and smooth concave and convex portions are provided on an upper surface of the resin. A film including molybdenum nitride (MoN) and a reflective pixel electrode film are successively laminated on the photosensitive resin. The nitrogen content in the MoN film may be between 5 atomic % and 30 atomic % inclusive.

13 Claims, 11 Drawing Sheets

| | Ar FLOW RATE | N₂ FLOW RATE | ETCHING RATE (nm/min.) | PEEL TEAT RESULT | ADHESION | N₂ ATOM % BY AUGER SPECTROSCOPY |
|---|---|---|---|---|---|---|
| CONDITION1 | 100 | 0 | 754 | 100/100 | × | |
| CONDITION2 | 100 | 20 | 648 | 48/100 | △ | 5 |
| CONDITION3 | 100 | 40 | 562 | 0/100 | ○ | 10 |
| CONDITION4 | 100 | 60 | 476 | 0/100 | ○ | |
| CONDITION5 | 100 | 80 | 319 | 0/100 | ○ | 25 |
| CONDITION6 | 100 | 100 | 257 | 0/100 | ○ | 30 |

× ALL ARE PEELED.
△ SOME ARE PEELED.
○ NONE ARE PEELED.

PATTERNED SUBSTRATE AND LIQUID CRYSTAL DISPLAY PROVIDED THEREWITH

BACKGROUND OF THE INVENTION

The present invention relates to a patterned substrate and a liquid crystal display provided therewith. The patterned substrate referred to herein means an electrically conductive material patterned substrate.

As office automation equipment such as a personal computer and the like has been made portable in recent years, it has become important to manufacture a display device in use for such office automation equipment at a low cost. This display device is formed by interposing a display medium having an electrooptic property between a pair of substrates having electrodes formed thereon. Display is performed by applying a voltage between these electrodes to change the electrooptic property of the display medium.

An active matrix type display device is becoming mainstream because of its display performance. In the active matrix type display device, each pixel is provided with a switching element capable of increasing the number of scanning lines. With techniques that enable the number of the aforementioned scanning lines and the like to increase, higher resolution, higher optical contrast, more gradations and wider visibility angle are being achieved.

In the active matrix type liquid crystal display, pixel electrodes are electrically connected via active elements (the aforementioned switching elements). The active elements include a two-terminal nonlinear element (MIM) and three-terminal nonlinear element. The active element typically used now is a thin film transistor (TFT), which is a three-terminal nonlinear element.

With increase in demand for electrodes with low power consumption in recent years, a reflective liquid crystal display and a reflective/transmissive liquid crystal display are increasingly developed instead of a transmissive liquid crystal display, which usually requires a backlight.

In order to obtain a bright display in the reflective liquid crystal display, the reflective electrode area is enlarged. Further, as a reflective electrode, an Al film is formed on a resin film having a plurality of concave and convex portions formed thereon to scatter an incident light. Also, wiring for transmitting picture signals and a driver for driving a liquid crystal display are connected by using ITO (indium-tin oxide) used for transparent electrode portions or the like for the purpose of preventing higher resistance due to oxidation during post-processing.

The above-described conventional liquid crystal display, however, has problems as described below. That is, when a reflective electrode is formed by forming an Al metal film on a resin film having a plurality of concave and convex portions formed thereon as described above, it is impossible to partially form an Al metal film, particularly in a mass production process, unless a special film forming method such as mask-deposition or the like is used. Therefore, the Al metal film is formed over the entire surface of a liquid crystal display panel including ITO portions such as terminal portions for connecting the wiring and the driver, transparent electrodes and the like. However, the following problem is caused when this reflective electrode film (Al metal film) is patterned.

When the Al film is etched into a prescribed shape in a state that the ITO film and the Al film are laminated, a photolithography process is performed. In this case, when an exposure and a development are performed to form a resist film, an battery is constituted between the ITO film and the Al film since an alkaline developer is used. As a result, the Al film and the ITO film are corroded and melted and thereby the yield decreases. This phenomenon, which is called electrolytic corrosion, occurs not only in the case of combination of an ITO film and an Al film, but occurs in any combination that causes a battery reaction by using an alkaline developer.

In order to solve this problem of electrolytic corrosion, there is a proposal that an Mo (molybdenum) film is formed before a metal film such as Al or the like is formed to make a two-layer structure. According to this technique, an Al layer and an Mo layer can be successively formed. Also, since the two layers can be etched simultaneously by using a liquid mixture composed of phosphoric acid, nitric acid, acetic acid and water, a reflective electrode film (Al film) can be patterned without increasing the number of processes or causing electrolytic corrosion.

By the way, in the case of patterning a metal film such as Al or the like formed on the resin film as a reflective electrode or a transparent conductive film, the metal film often peels because the adhesion between the resin film and the metal film is weakened due to the swelling of the resin film by a resist remover. The aforementioned Mo layer also peels from the resin film when a peel test is performed after the Mo film is formed on an acrylic resin and patterned. As a result, the yield decreases.

In general, in the case where metal wiring is provided on an insulator such as a polymeric film or the like, the problem is that the adhesion between the polymeric film and the metal film is weak. Thus, various attempts have been conventionally made. For example, it is revealed that sputtering is more effective than vapor deposition to obtain strong adhesion when the metal film is formed. However, there is a problem that sufficient adhesion cannot be obtained even by sputtering when the aforementioned Mo film is formed.

SUMMARY OF THE INVENTION

Accordingly, an object of the present invention is to provide a patterned substrate and a display provided therewith with high product yield and reliability by improving adhesion of a metal film formed on an insulating film to the insulating film.

In order to achieve the above object, the present invention provides a patterned substrate comprising: a metal film, an insulating film adjacent to the metal film, and a molybdenum nitride film formed at least on a side of the metal film which is in contact with the insulating film.

According to the above constitution, when the crystal structure of the Mo is changed by nitriding Mo, the adhesion with the insulating film composed of a polymeric resin or the like is improved. An MoN film is formed at least on a side of the metal film constituting an electrode or wiring brought into contact with the insulating film. Therefore, even in the case where a polyethylene terephthalate (PET) film is used as the insulating film, the adhesion between the PET film and the metal film (wiring) is improved and thereby the product yield and reliability are improved.

In one embodiment of the present invention, the molybdenum nitride film has a nitrogen content between 5 atomic % and 30 atomic % inclusive.

According to the above constitution, since the nitrogen content in the MoN film is 5 atomic % or more, the adhesion between the insulating film and the metal film is sufficiently improved. Since the nitrogen content is 30 atomic % or less, the etching rate of the MoN film does not decrease. Therefore, deterioration of the throughput of the patterning process due to the time-consuming process of etching the metal film is prevented.

In one embodiment of the present invention, a liquid crystal display is provided with the above patterned substrate.

According to the above constitution, since wiring is formed on the insulating film with favorable adhesion, the product yield and reliability of the liquid crystal display are improved.

The present invention also provides a liquid crystal display comprising: a pair of substrates, a liquid crystal layer interposed between the pair of substrates, a laminated layer provided on at least one of the substrates, wherein the laminated layer is formed by laminating an insulating film and a molybdenum nitride film on the substrate, and a reflective metal film having a light reflecting function and provided in pixel regions obtained by dividing the liquid crystal layer into a plurality of segments, wherein the reflective metal film is formed on the laminated layer.

According to the invention, the adhesion between the insulating film composed of a polymeric resin or the like and the Mo film is improved by nitriding Mo. The MoN film and the reflective metal film are successively laminated on the insulating film. Therefore, even in the case where an acrylic resin is used as the insulating film, the adhesion between the acrylic resin and the reflective metal film is improved and thereby the product yield and reliability are improved.

In one embodiment of the present invention, the molybdenum nitride film has a nitrogen content between 5 atomic % and 30 atomic % inclusive.

According to the above constitution, since the nitrogen content in the MoN film is 5 atomic % or more, the adhesion between the insulating film and the reflective metal film is sufficiently improved. Since the nitrogen content is 30 atomic % or less, the etching rate does not decrease. Therefore, the deterioration of the throughput of the patterning process due to the time-consuming process of etching the MoN film and the reflective metal film is prevented.

In one embodiment of the present invention, the reflective metal film serves as an electrode for applying a voltage to the liquid crystal layer.

According to the above constitution, since the adhesion between the insulating film and the reflective/pixel electrodes is improved, a reflective liquid crystal display with high product yield and reliability can be obtained.

In one embodiment of the present invention, an indium-tin oxide film is formed on a side of a substrate on which the reflective metal film is formed.

According to the above constitution, an Al metal film is used as the reflective metal film and an indium-tin oxide (ITO) film functioning as terminals for connecting with a driver and a transparent electrode is formed on the substrate. Even in the case of patterning the Al metal film formed on the ITO film, electrolytic corrosion between the Al metal film and the ITO film is prevented since the Mo film is formed between the Al metal film and the ITO film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below with reference to the embodiments shown in the accompanying drawings, but the present invention is not limited to the embodiments described below.

First Embodiment

Figure 1:
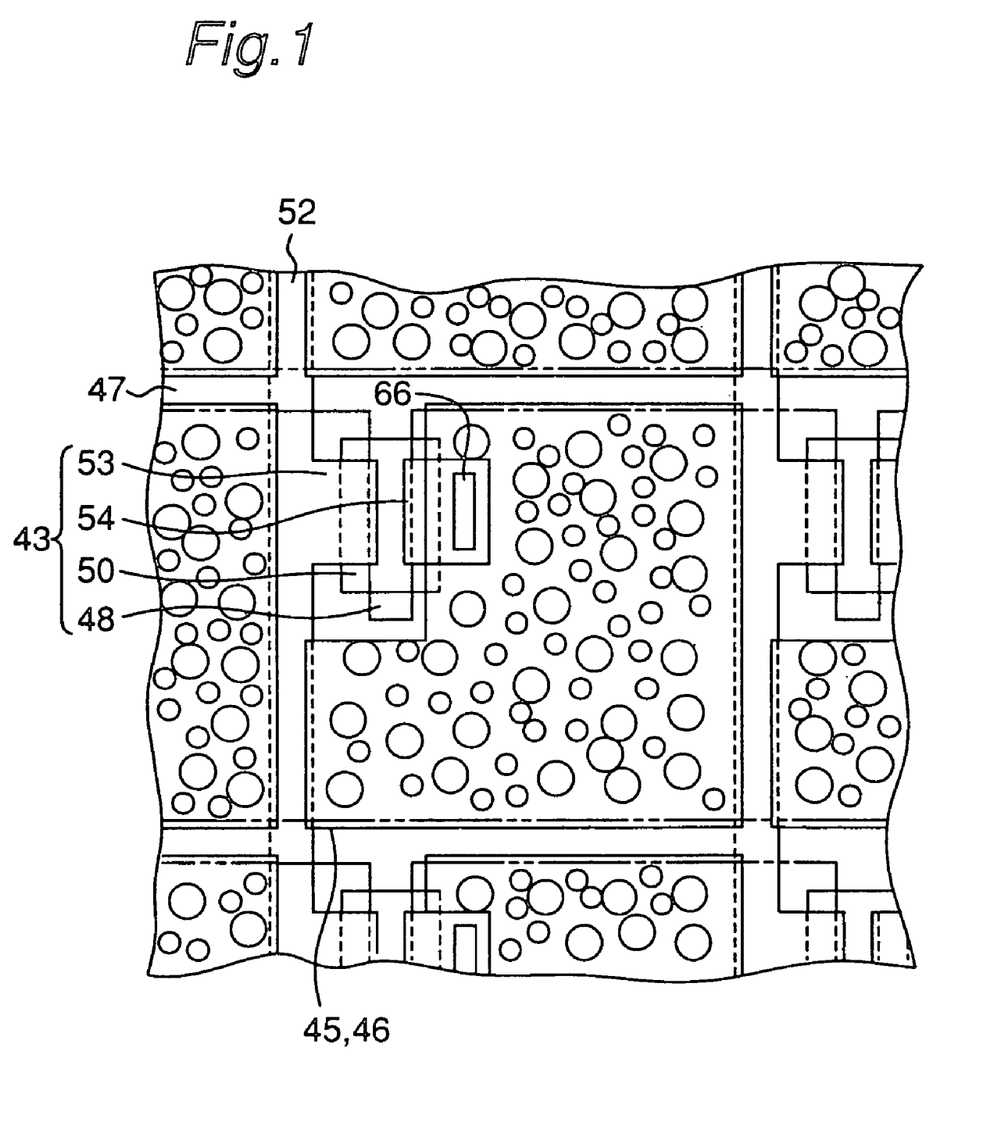
FIG. 1 is a plan view showing a pixel region of a reflective liquid crystal display as a liquid crystal display of the present invention.
Figure 2A:
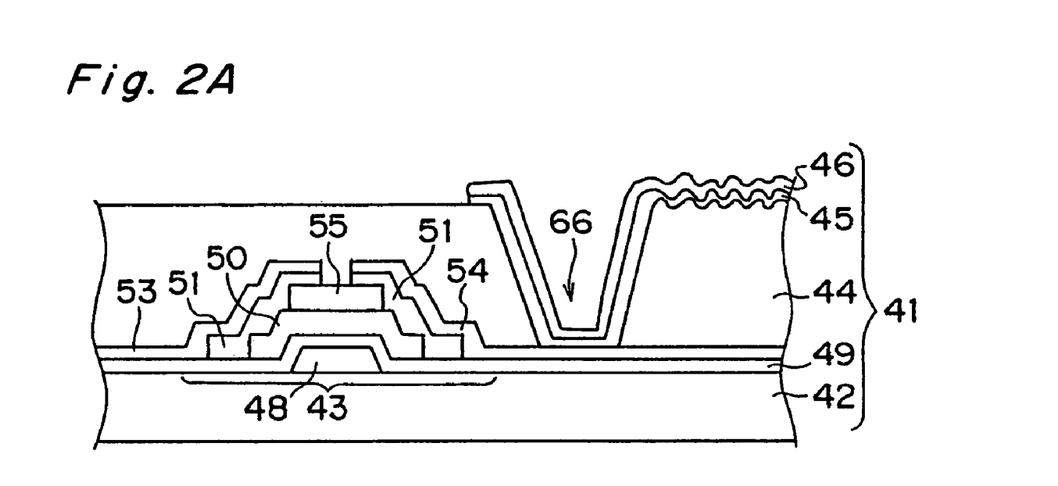
FIG. 2A is a longitudinal sectional view of a reflective substrate of FIG. 1.

FIG. 1 is a plan view showing a pixel region of a reflective liquid crystal display as a liquid crystal display of the present embodiment. FIG. 2A is a longitudinal sectional view including a reflective substrate in FIG. 1.

In the reflective liquid crystal display of this embodiment, as shown in FIG. 2A, a thin film transistor (TFT) 43 for a switching element is formed on an insulating substrate 42 that is composed of glass or the like. Further, a photosensitive resin 44, a MoN film 45 and a reflective electrode 46 are successively formed on the insulating substrate 42 including this TFT to constitute a reflective substrate 41 having smooth concave and convex portions. The photosensitive resin 44 has a function as an interlayer insulating film having concave and convex portions. It is noted that the MoN layer 45 has adhesion and an electrolytic corrosion preventing function. Al forms the reflective electrode 46.

The TFT 43 is formed by successively laminating a gate electrode 48, a gate insulating layer 49, a semiconductor layer 50, an n-type semiconductor layer 51, a data bus line 52 (not shown), a source electrode 53 and a drain electrode 54 on the insulating substrate 42 of glass or the like, as shown in FIG. 2A.

The gate electrode 48 is composed of Ta (tantalum) and branched from the gate bus line 47 which is a scanning signal line. The gate insulating layer 49 is composed of SiNx. The semiconductor layer 50 is composed of a-Si (amorphous silicon). The n-type semiconductor layer 51 is composed of n-type a-Si. The source electrode 53 is composed of ITO and branched from the data bus line 52. The drain electrode 54 is composed of Ti (titanium) and so forth. A numeral 55 denotes an etch stopper.

Figure 2B:
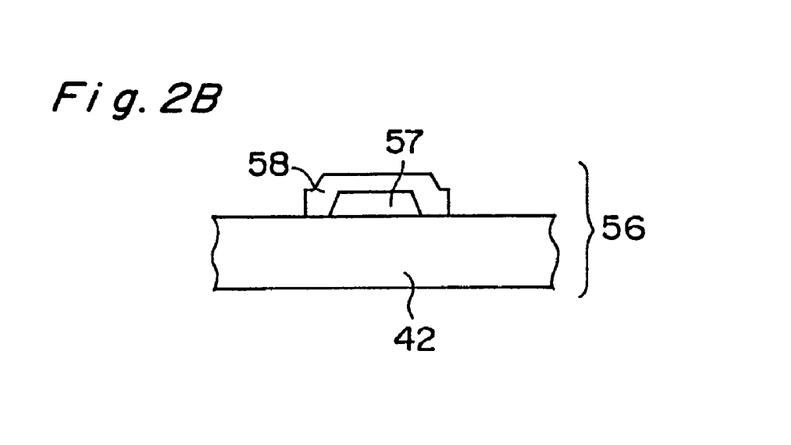
FIG. 2B is a longitudinal sectional view of a signal input terminal.

As shown in FIG. 2B, the signal input terminal 56 for inputting a signal to the gate bus line (not shown) and a source bus line (not shown) is constituted by two layers of a terminal electrode 57 and a terminal connecting electrode 58. The terminal electrode 57 is composed of Ta and patterned simultaneously with the gate bus line 47 and the gate electrode 48. The terminal connecting electrode 58 is composed of ITO.

Figure 3:
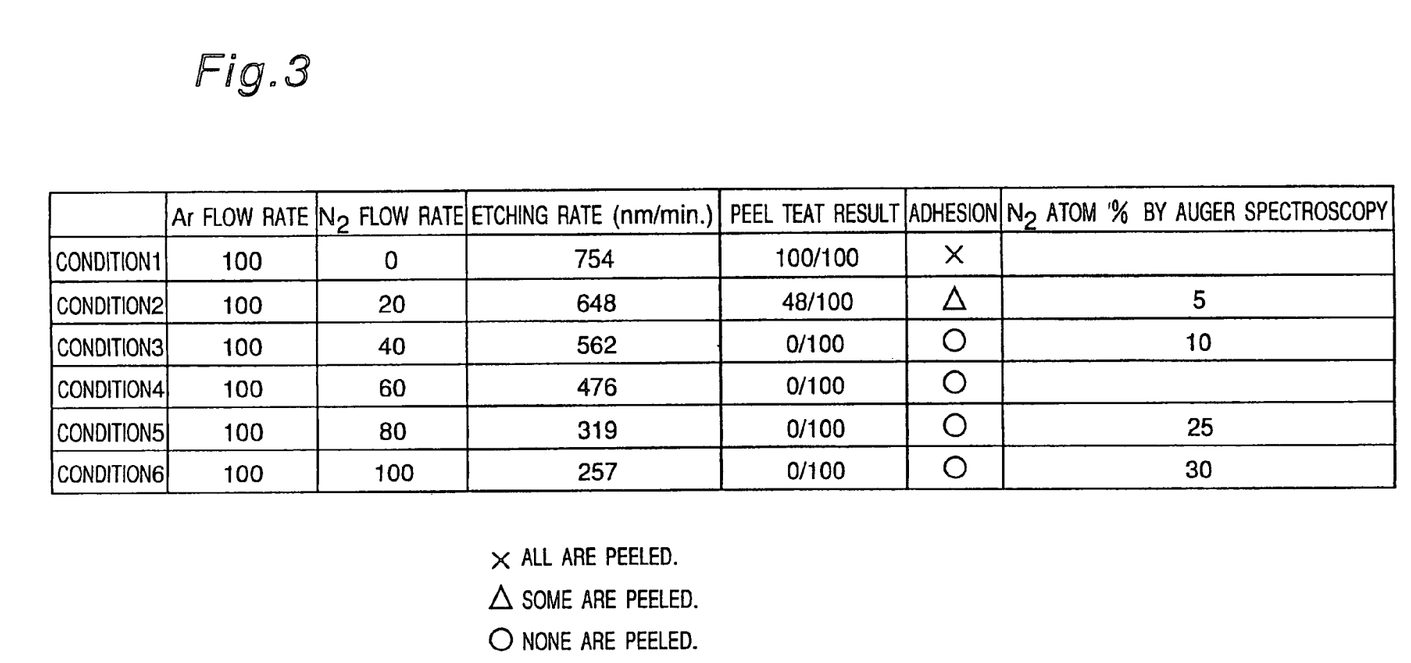
FIG. 3 is a table showing the relationship between adhesion and flow rates of N2 during formation of an MoN film.

The structure of the MoN layer 45 will be described below. FIG. 3 shows the relationship between adhesion and the component ratio of N2 (nitrogen) gas and Ar (argon) gas i.e. N2/Ar when the MoN film 45 is formed on a photosensitive resin 44 of acrylic resin.

When the Mo film is formed on the photosensitive resin 44 with only Ar at an flow rate of 100 sccm (standard cubic centimeters per minute), 100 squares out of 100 squares were peeled off as a result of the peel test described blow. However, when N2 was added to Ar at a flow rate of 20 sccm, only 48 squares were peeled off, that is, the adhesion was improved significantly. Further, when N2 was increased and added at a flow rate of 40 sccm, no squares were peeled off. In this case, as a result of checking the N2 content (atomic %) by using an Auger spectroscopic system, the N2 content was about 10%.

When N2 was added to Ar at a flow rate of 60 sccm, 80 sccm and 100 sccm, no squares were peeled off as in the case of adding N2 at the flow rate of 40 sccm. It is noted that, when the flow rates of N2 were 80 sccm and 100 sccm, the N2 content (atomic %) was about 25% and 30%, respectively.

The peel test described above is defined as a test for examining the degree of intensity of adhesion of the thin film to a substrate by sticking an adhesive tape having a viscosity onto the thin film on the substrate and checking whether the thin film stays on the substrate side or sticks to the adhesive tape when the adhesive tape is peeled. Specifically, (1) In accordance with the JIS standard (JIS K-5400), a resin film on which a test film is formed is incised by using a cutter knife to make 100 squares the size with one by one mm.
(2) After an adhesive tape is stuck on the test film incised into squares, the tape is peeled at a certain peeling angle.
(3) Then, the adhesion between the test film and the resin film is evaluated by checking how many squares of the 100 test film squares are peeled off. That is, if 100 squares are peeled off, the adhesion is evaluated as weak while the adhesion is evaluated as sufficient if no square is peeled off.

The conditions for measuring the N2 content by using the Auger spectroscopic system are as follows:
  Auger spectroscopic system: SAM670 manufactured by Perkin Elmer Instruments, Inc.
  Electron beam accelerating voltage: 3 kV
  Electron beam current: 22 nA
  Electron beam diameter: 1600 Å
  Electron beam incident angle: 60°

The above results suggest that adhesion between the photosensitive resin (acrylic resin) 44 and the MoN layer 45 can be enhanced by nitriding the Mo film formed on the photosensitive resin 44. In this case, the etching rate decreases by nitriding the Mo film. As shown in FIG. 3, the etching rate of the Mo film is the largest when the flow rate of N2 is 0 sccm. As the flow rate of N2 increases, the etching rate decreases. When the flow rate of N2 is 100 sccm, the etching rate is one third of the etching rate when the flow rate is 0 sccm. The smaller the etching rate is, the more time for etching is required and thereby the throughput decreases. Therefore, in the present invention, the decrease of the throughput to one third is made the limit and the N2 content in the MoN layer is made between 5 atomic % and 30 atomic % inclusive.

As described above, the Mo layer is nitrided to increase the adhesion of the Mo layer formed on the photosensitive resin 44. It is noted that, in this case, the adhesion between the Al film as a reflective electrode 46 formed on the MoN film 45 and the MoN film does not become weaker than the adhesion between the Al film and the Mo film.

The processes for manufacturing a reflective substrate 41 in the present reflective liquid crystal display, particularly, the processes for forming the MoN layer 45 (electrolytic corrosion preventing film having concave and convex portions for obtaining adhesion) on the photosensitive resin 44 and the reflective electrode 46 composed of Al will be described below. FIGS. 4A to 4K are sectional views showing the processes for manufacturing the reflective substrate 41 in FIG. 2A. It is noted that sectional views showing the processes for forming a pixel region are shown on the left side in the figure and sectional views showing the processes for forming a signal input terminal region are shown on the right side.

Figure 4A:
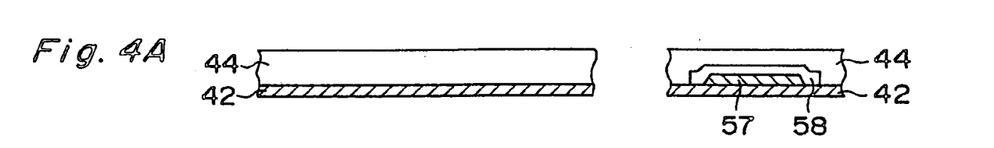
FIGS. 4A to 4K are sectional views showing processes for manufacturing the reflective substrate.
Figure 4B:
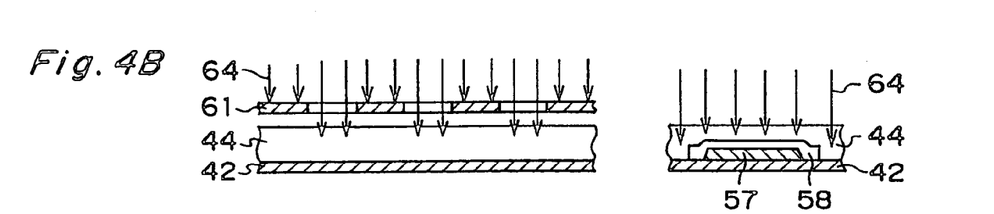
Figure 4C:
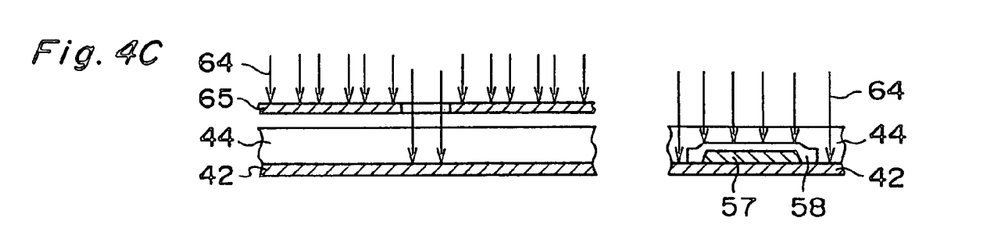
Figure 5:
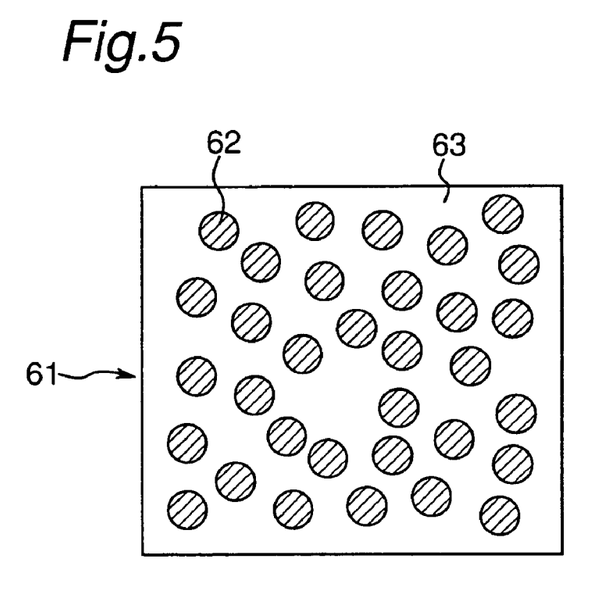
FIG. 5 is a plan view showing a first photomask in FIG. 4B.
Figure 6:
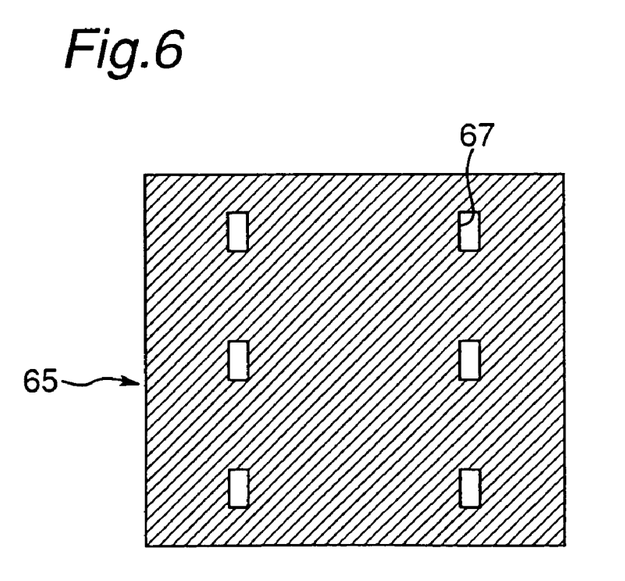
FIG. 6 is a plan view showing a second photomask in FIG. 4C.

As shown in FIG. 4A, a positive photosensitive resin 44 (Product Name: OFPR-800 made by Tokyo Ohka Kogyo Co., Ltd.) as an interlayer insulating film with a thickness of 1–5 μm is coated on an insulating substrate 42 such as glass or the like on which the aforementioned TFT 43 (not shown in FIGS. 4A to 4K) is formed. The positive photosensitive resin 44 is coated to a thickness of 3 μm in this embodiment. Then, as shown in FIG. 4B, a first photomask 61 where circular light-shielding portions 62 shown in FIG. 5 are formed at an area occupation rate between 20% and 40% inclusive is disposed to perform a first exposure uniformly by using ultraviolet light 64 with low illumination. Subsequently, as shown in FIG. 4C, a second photomask 65 shown in FIG. 6 is disposed to perform a second exposure of contact hole 66 forming portions by using ultraviolet light 64 with high illumination.

The first photomask 61 has light-shielding portions (not shown in FIG. 5) corresponding to the positions of TFT 43 and the opening portions (not shown in FIG. 5) corresponding to the positions of contact holes 66. Further, the circular light-shielding portions 62 are disposed at random in such a way that the center distance between adjacent circular light-shielding portions 62 is between 5 μm and 50 μm inclusive, preferably 10 μm–20 μm. It is noted that a numeral 63 denotes a transparent portion in FIG. 5. As shown in FIG. 6, the second photomask 65 has transmissive portions 67 opened corresponding to the positions of contact holes 66. Both the photomasks 61, 65 are constructed in such a way that the positions of signal input terminals 56 coincide with the transmissive portions. Therefore, the signal input terminals 56 can be exposed by the ultraviolet light 64 at the same time as the exposure of the contact holes 66.

Figure 4D:
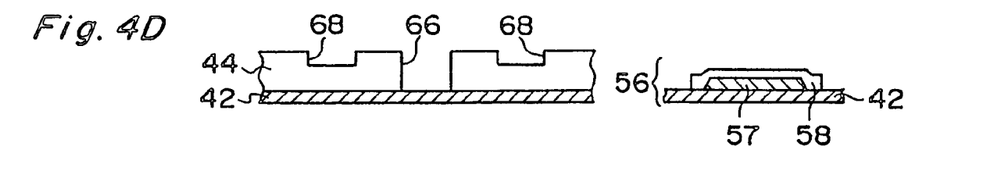

Subsequently, as shown in FIG. 4D, a development is performed by using TMAH (tetramethylammonium hydroxide) manufactured by Tokyo Ohka Kogyo Co., Ltd. as a developer so that the photosensitive resin 44 of the above-described high illumination exposure portions (the portions of the contact holes 66 and signal input terminals 56 exposed twice as described above) is completely removed. The photosensitive resin 44 of the low illumination exposure portions 68 (the transparent portion 63 exposed once by the above first exposure) is left at a thickness of about 40% of the initial film thickness. The photosensitive resin 44 of the unexposed portion (the portions of the TFT 43 and the circular light-shielding portions 62) is left at a thickness of about 80% of the initial film thickness.

Figure 4E:
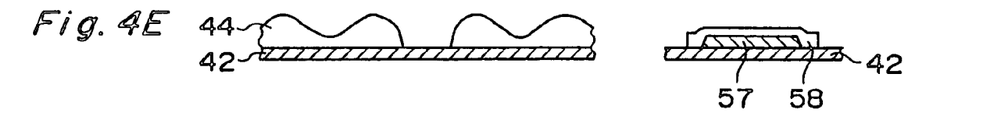
Figure 4F:
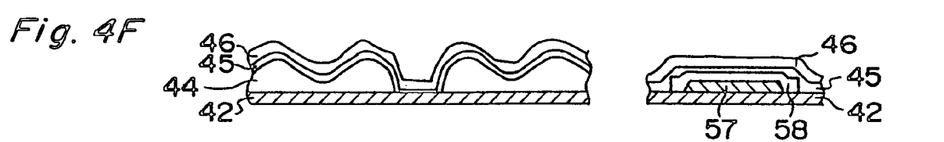

Subsequently, heat treatment is performed at 200° C. for 60 minutes to deform the photosensitive resin 44 by heat sagging, and thereby smooth concave and convex portions are formed on the surface, as shown in FIG. 4E. Then, MoN film 45 and Al film 46 in thickness of 500 Å and 1000 Å respectively are formed on the insulating substrate 42 by sputtering, as shown in FIG. 4F. The MoN film 45 is formed under an atmosphere having a gas pressure of 0.5 Pa with Ar at 100 sccm and N2 at 40 sccm by DC magnetron sputtering. The Al film 46 is formed under an atmosphere having a gas pressure of 0.4 Pa with Ar at 100 sccm.

Figure 4G:
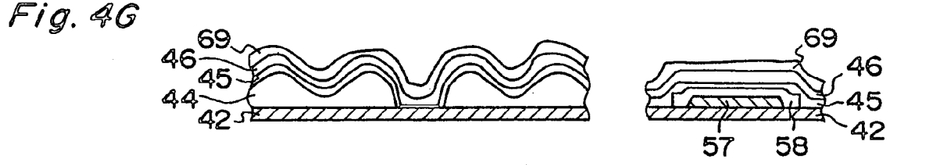
Figure 4H:
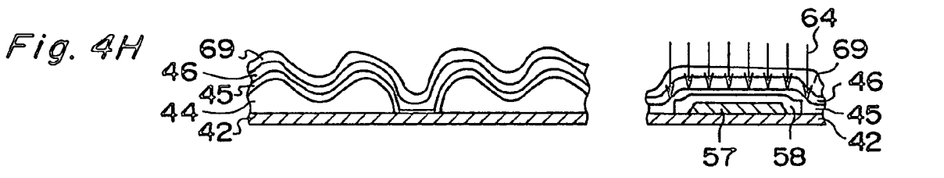
Figure 4I:
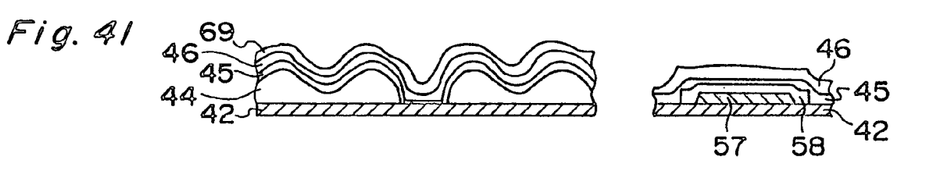
Figure 4J:
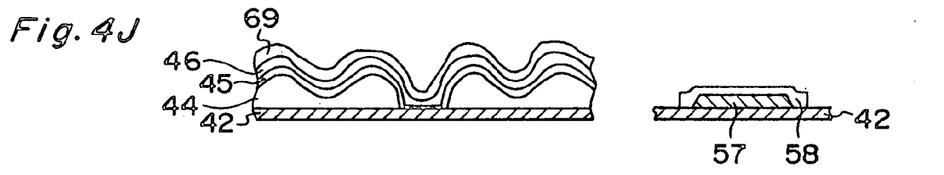
Figure 4K:
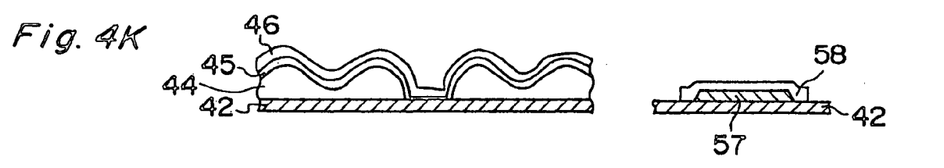

Then, as shown in FIGS. 4G to 4K, patterning is performed so that one reflective electrode 46 is provided in one TFT 43. Specifically, in order to pattern a film laminated with the MoN film 45 and the reflective electrode 46, a photoresist 69 is applied as shown in FIG. 4G. Then, perforated portions for isolating respective pixel electrodes and the signal input terminals 56 are exposed with a ultraviolet light 64 as shown on the right side portion of FIG. 4H. Subsequently, the development process, etching process and removing process are performed as shown in FIGS. 4I to 4K.

A reflective electrode 46 having smooth concave and convex portions in a high density can be formed by the above processes. Since such a reflective electrode 46 has less planar portions, an ideal reflecting characteristic with less specularly reflecting components can be achieved. Also, the number of photo processes for the photosensitive resin 44 can be reduced and the cost required to manufacture the reflective electrode 46 can also be reduced.

Finally, the reflective substrate 41 (not shown in FIGS. 4A to 4K) formed as described above and a color filter substrate for supporting the transparent electrode (not shown in FIGS. 4A to 4K) are laminated via spacers, and liquid crystal is injected between these substrates. Then, a phase difference plate and a polarizing plate are laminated with the color filter substrate to complete a reflective liquid crystal display.

As described the above, when a reflective liquid crystal display is fabricated, the TFT 43 is formed on the insulating substrate 42, and the photosensitive resin 44 film is further formed as the interlayer insulating film covering the TFT 43 in this embodiment. Then, two exposures are performed by using the first photomask 61 having scattered circular light-shielding portions 62 and the second photomask 65 so as to form the contact holes 66 in the photosensitive resin 44 and form smooth concave and convex portions on regions other than the TFT 43. Subsequently, the MoN film 45 and the reflective electrode 46 are successively laminated on the photosensitive resin 44 on which the concave and convex portions are formed, and thus the reflective electrode 46 having smooth concave and convex portions in a high density is formed.

Therefore, the reflective substrate 41 having the reflective electrode 46 which has few specularly reflecting components and can achieve a paper-white display in one pixel region can be formed.

At this time, as shown in FIG. 4F, the reflective electrode 46 film formed on the entire surface of the insulating substrate 42 is formed on the MoN film 45. Consequently, the MoN film 45 is present between the reflective electrode 46 composed of an Al film and the terminal connecting electrode 58 composed of ITO constituting the signal input terminal 56, as shown in FIG. 4G. Therefore, when the laminated film formed of both the MoN layer 45 and the reflective electrode 46 is patterned, electrolytic corrosion does not occur between the ITO film and the Al film because of the presence of the MoN layer 45 therebetween even if an alkaline developer is used to form a resist film by photolithography.

As described above with reference to FIG. 3, when the N2 content is less than 5 atomic % during formation of the MoN film 45 on the photosensitive resin 44, the adhesion of the MoN layer 45 to the photosensitive resin 44 (acrylic resin) is weak, which is not practical. On the other hand, when the N2 content is more than 30 atomic %, the etching rate decreases and thereby time required for etching is prolonged. In this case, the throughput of the process for patterning the MoN layer 45 and the reflective electrode 46 is deteriorated. That is, the MoN layer 45 can obtain strong adhesion to the photosensitive resin 44 and the deterioration of the throughput of the patterning process can be prevented by preventing the decrease of the etching rate by making the N2 content between 5 atomic % and 30 atomic % inclusive in this embodiment.

Second Embodiment

Figure 7:
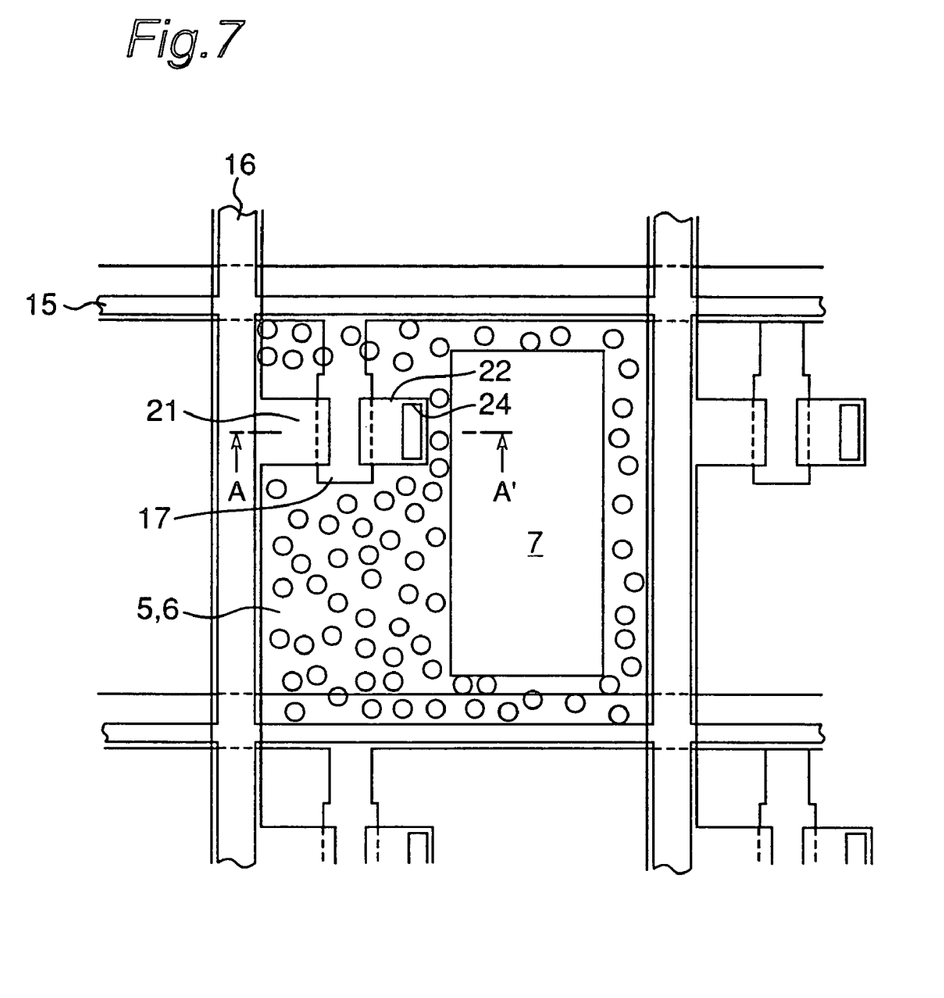
FIG. 7 is a plan view showing a pixel region of a transmissive/reflective liquid crystal display as a liquid crystal display of the present invention.
Figure 8:
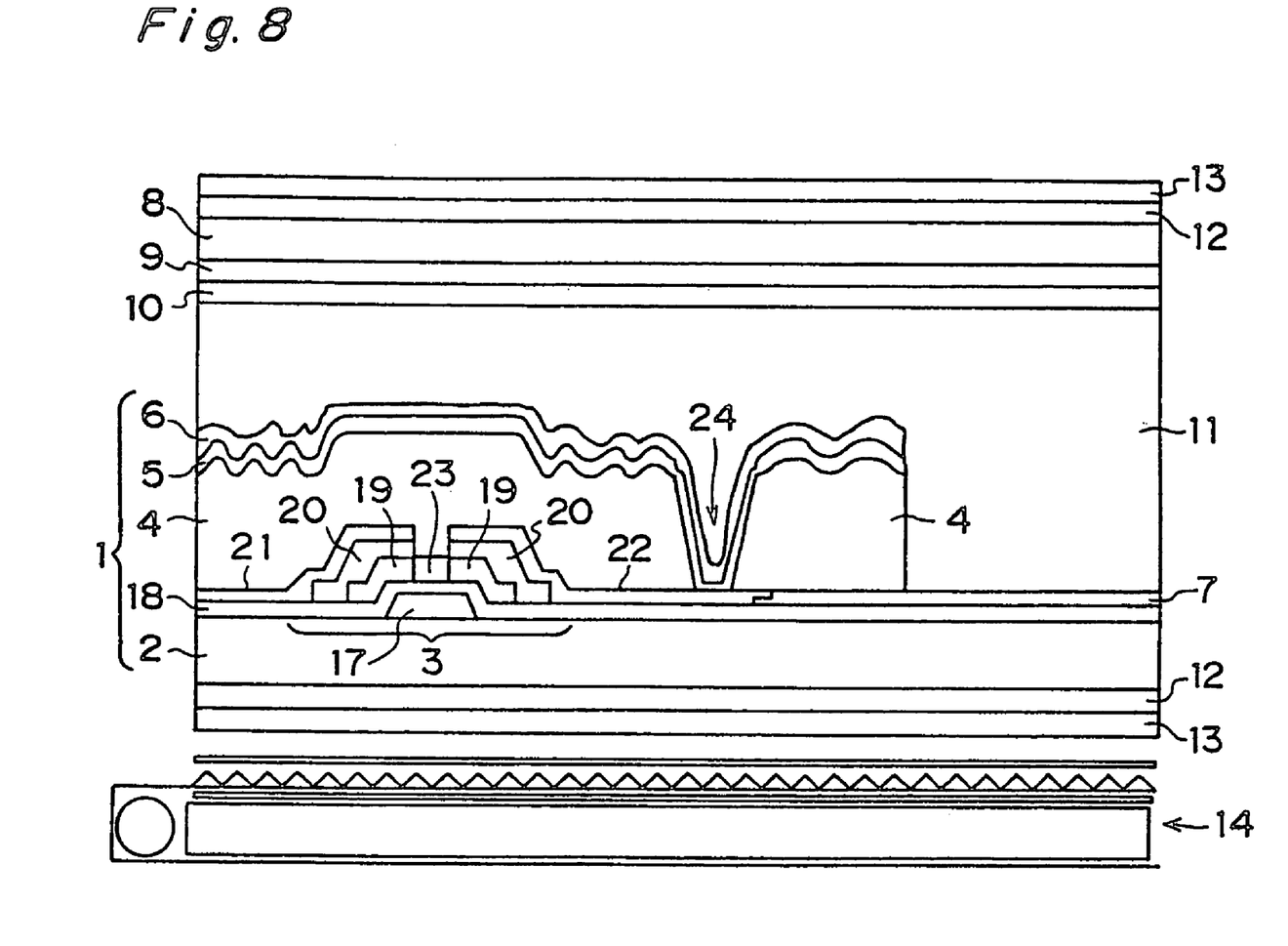
FIG. 8 is a sectional view along line A–A' in FIG. 7.

FIG. 7 is a plan view showing a pixel region of a transmissive/reflective liquid crystal display as a liquid crystal display of this embodiment. FIG. 8 is a cross sectional view taken along line A–A' of FIG. 7.

In this transmissive/reflective liquid crystal display of the present embodiment, as shown in FIG. 8, a TFT 3 as a switching element is formed on an insulating substrate 2. A photosensitive resin 4 as an interlayer insulating film having concave and convex portions, an MoN film 5 and reflective electrode 6 are successively formed on the insulating substrate 2 including this TFT 3 to constitute a transmissive/reflective substrate 1. Further, a transparent electrode 7 is formed on the insulating substrate 2. It is noted that the MoN layer 5 has adhesion and an electrolytic corrosion preventing function. The reflective electrode 6 is formed out of Al and the transparent electrode 7 is formed out of ITO. The reflective electrode 6 and the transparent electrode 7 constitute the reflective portion and the transmissive portion of the pixel region.

A color filter layer 9 and a transparent electrode 10 are successively formed on a color filter substrate 8 opposed to the transmissive and reflective substrate 1. Then, a liquid crystal layer 11 is provided between the transmissive/reflective substrate 1 and the color filter substrate 8 opposed to each other with the transparent electrode 10 facing the reflective electrode 6. Phase difference plates 12, 12 and polarizing plates. 13, 13 are disposed outside both the substrates 1, 8. Further, a backlight 14 is disposed on the outermost side of the transmissive/reflective substrate 1.

It is noted that a polarization mode is employed as a liquid crystal display mode in this embodiment, but the present invention is not limited to this mode. For example, if a guest host mode is employed, the phase difference plate 12 and the polarizing plate 13 can be omitted.

As described above, the TFT 3 is formed on the insulating substrate 2 composed of glass or the like as shown in FIGS. 7 and 8. This TFT 3 is constituted on the insulating substrate 2 by successively forming a gate bus line 15, which is a scanning signal line, a gate electrode 17 composed of Ta branched from this gate bus line 15, a gate insulating layer 18 composed of SiNx, a semiconductor layer 19 composed of a-Si, an n-type semiconductor layer 20 composed of n-type a-Si, a data bus line 16, a source electrode 21 composed of a laminated film of Ta and ITO branched from this data bus line 16, a drain electrode 22 composed of a laminated film of Ta and ITO and so forth. This TFT 3 functions as a switching element for connecting the drain electrode 22 to the data bus line 16. It is noted that the numeral 23 denotes a channel region formed in the semiconductor layer 19.

An extended portion of the drain electrode 22 is formed out of only ITO. This ITO portion is a transparent electrode 7 constituting part of a pixel electrode. As described above, the reflective electrode 6 constituting part of the pixel electrode is connected to the drain electrode 22 via the MoN layer 5 and the contact holes 24. The reflective electrode 6 is extended over the transparent electrode 7 via the photosensitive resin 4 as an interlayer insulating film. The N2 content in the MoN layer 5 is between 5% and 30% inclusive as is the case with the first embodiment.

The processes for manufacturing the transmissive/reflective substrate 1 in the present transmissive/reflective liquid crystal display, particularly, the processes for forming the MoN layer 5 (the electrolytic corrosion preventing film having concave and convex portions for obtaining adhesion) and a reflective electrode 6 onto the photosensitive resin 4 will be described below. FIGS. 9A to 9D are sectional views showing processes for manufacturing the transmissive/reflective substrate 1 in FIG. 8. This embodiment is also provided with a signal input terminal having a two-layer structure of a terminal electrode and a terminal connecting electrode composed of ITO as in the case of the first embodiment. However, only a pixel region is shown and the processes for manufacturing this signal input terminal are omitted in FIGS. 9A to 9D since the processes are the same as in the case of the first embodiment.

Figure 9A:
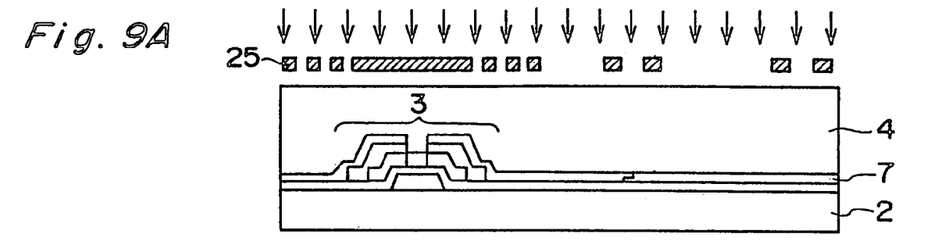
FIGS. 9A to 9D are sectional views showing processes for manufacturing a transmissive/reflective substrate in FIG. 8.
Figure 9B:
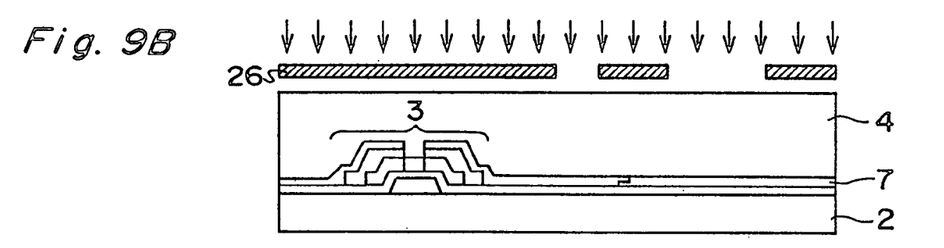
Figure 10:
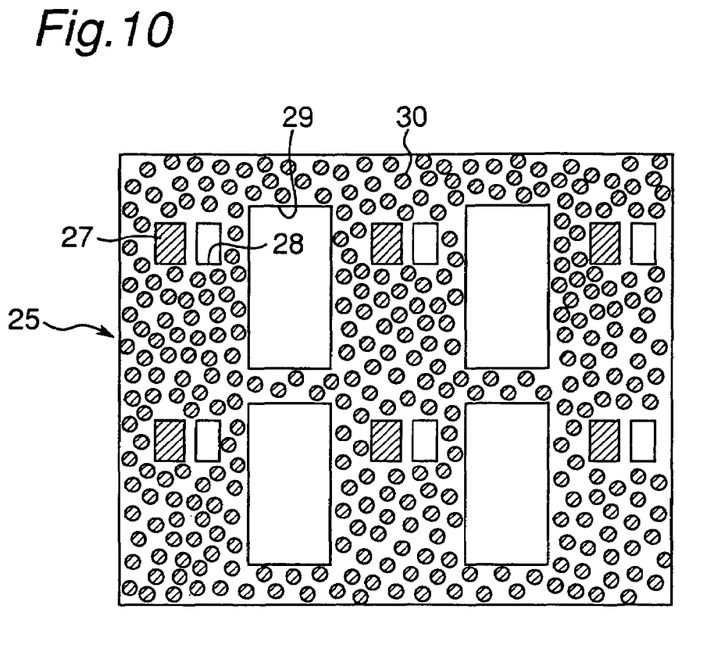
FIG. 10 is a plan view showing a first photomask in FIG. 9A.
Figure 11:
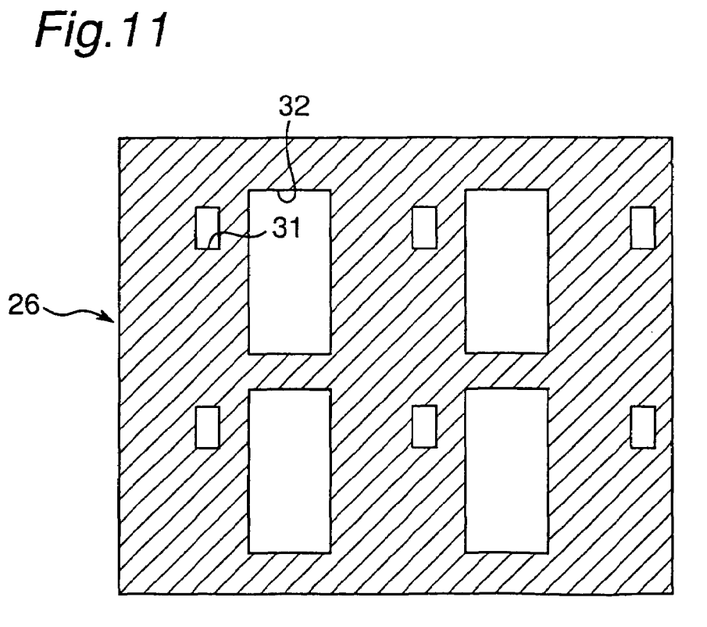
FIG. 11 is a plan view showing a second photomask in FIG. 9B.

As shown in FIG. 9A, the photosensitive resin 4 as an interlayer insulating film is applied at a thickness of 1 μm–5 μm on the surface of the insulating substrate 2 on which the TFT 3 and the transparent electrode 7 are formed. In this embodiment, a 4-μm thick film is formed. In this state, a first photomask 25 as shown in FIG. 10 is disposed to perform a first exposure at 52 milli-joule. Subsequently, a second photomask as shown in FIG. 11 is disposed to perform a second exposure as shown in FIG. 9B.

As shown in FIG. 10, the first photomask 25 shields light completely in the regions 27 corresponding to TFT 3 and completely opens in the regions 28 corresponding to the contact holes 24 and the regions 29 corresponding to the transmissive regions. A portion of the first photomask 25 other than the above regions 27, 28, 29 is scattered with the circular light-shielding portions 30. The second photomask 26 completely opens only in the regions 31 corresponding to the contact holes 24 and the regions 32 corresponding to the transmissive regions as shown in FIG. 11.

Then, the photosensitive resin 4 on the insulating substrate 2 is developed. At this time, the photosensitive resin 4 of the regions irradiated with light by the first exposure is subjected to weak exposure because of only one exposure. Therefore, the photosensitive resin 4 is not completely removed and 10% to 50% of the film thickness is reduced as compared with the regions (regions on the TFT 3) which are not exposed at all because they are covered with both photomasks 25, 26. As a result, concave and convex portions are formed on the surface as shown in FIG. 9C.

Figure 9C:
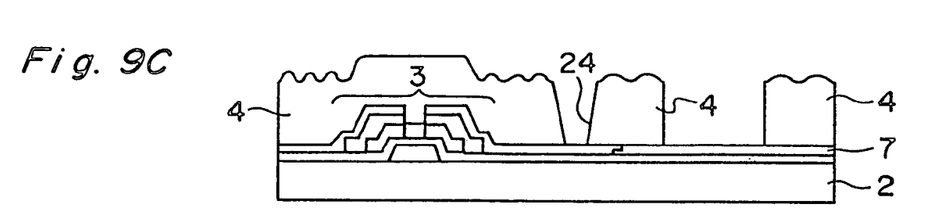

On the other hand, the photosensitive resin 4 of the regions (regions of the contact hole 24 forming portions and the transmissive portions) irradiated with light by the first and second exposures is subjected to strong exposure since two exposures are performed and is completely removed as shown in FIG. 9C.

Figure 9D:
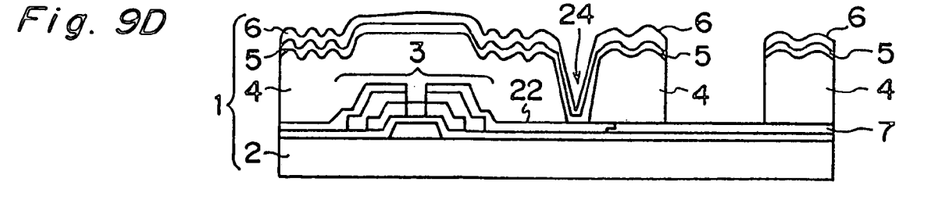

Subsequently, as shown in FIG. 9D, on the photosensitive resin 4 having smooth concave and convex portions as described above, a MoN film and an Al film are successively formed by sputtering at a thickness of about 500 Å and 1000 Å, respectively. Then, patterning is performed in such a way that one reflective electrode 6 is provided on one TFT 3, so as to form a laminated film composed of the MoN layer 5 and the reflective Al electrode 6.

The MoN film is formed by DC magnetron sputtering under an atmosphere having a gas pressure of 0.5 Pa with Ar at 100 sccm and N2 at 40 sccm. The Al film is formed under an atmosphere having a gas pressure of 0.4 Pa with Ar at 100 sccm. The patterning is performed by forming a mask pattern with photolithography and then by etching two layers of the MoN film and the Al film simultaneously by a mixture liquid composed of phosphoric acid, nitric acid, acetic acid and water.

The reflective electrode 6 is connected to the drain electrode 22 of the TFT 3 via the contact holes 24 and is formed along the smooth concave and convex portions formed on the photosensitive resin 4. Therefore, the surface of the reflective electrode 6 contributing display also has irregular circular protrusions and recesses according to the concave and convex portions of the photosensitive resin 4.

As described above, when a transmissive/reflective liquid crystal display is fabricated according to this embodiment, the TFT 3 and the transparent electrode 7 are formed on the insulating substrate 2, and the photosensitive resin film 4 is further formed as the interlayer insulating film covering the TFT 3. Then, two exposures are performed by using the first photomask 25 on which a plurality of circular light-shielding portion 30 are scattered and the second photomask 26 so as to form contact holes 24 in the photosensitive resin 4 and the transmissive regions and form smooth concave and convex portions on regions other than the TFT 3. Subsequently, the MoN film 5 and the reflective electrode 6 are successively laminated on the photosensitive resin 4, on which the concave and convex portions are formed, to form the reflective electrode 6 having smooth concave and convex portions in a high density.

Therefore, the transmissive/reflective substrate 1 is formed to have the reflective electrode 6 which has few specularly reflecting components and can achieve paper-white display in one pixel region.

At this time, the reflective electrode 6 of an Al film is opposed to the transparent electrode 7 of an ITO film and the source electrode 21 and the drain electrode 22, which 21, 22 are made of a two-layer film of ITO and Ta, via the photosensitive resin 4 as an interlayer insulating film and the MoN film 5. Therefore, when the laminated film of the MoN layer 5 and the reflective electrode 6 is patterned, electrolytic corrosion does not occur between the ITO film and the Al film because of the presence of the MoN layer 5 therebetween even if an alkaline developer is used to form a resist film by photolithography.

When the reflective electrode 6 of an Al film is formed on the photosensitive resin 4, the reflective electrode 6 is formed on the photosensitive resin 4 via the MoN film 5. Therefore, when the reflective electrode 6 is formed on the terminal connecting electrode composed of ITO as described above, the MoN film is present between the terminal connecting electrode (ITO) and the Al film (reflective electrode 6). Therefore, when the laminated film of the MoN layer 5 and the reflective electrode 6 is patterned, electrolytic corrosion does not occur between the ITO film (terminal connecting electrode) and the Al film (reflective electrode 6)

because of the presence of the MoN layer 5 therebetween even if an alkaline developer is used to form a resist film by photolithography.

In this embodiment, the MoN layer 5 can similarly obtain strong adhesion to the photosensitive resin 4 and the deterioration of the throughput of the patterning process can be prevented by preventing the decrease of the etching rate by making the N2 content between 5 atomic % and 30 atomic % inclusive.

Third Embodiment

This embodiment relates to a patterned substrate obtained by forming a MoN interconnect pattern on a resin by utilizing advantages of the MoN.

Figure 12:
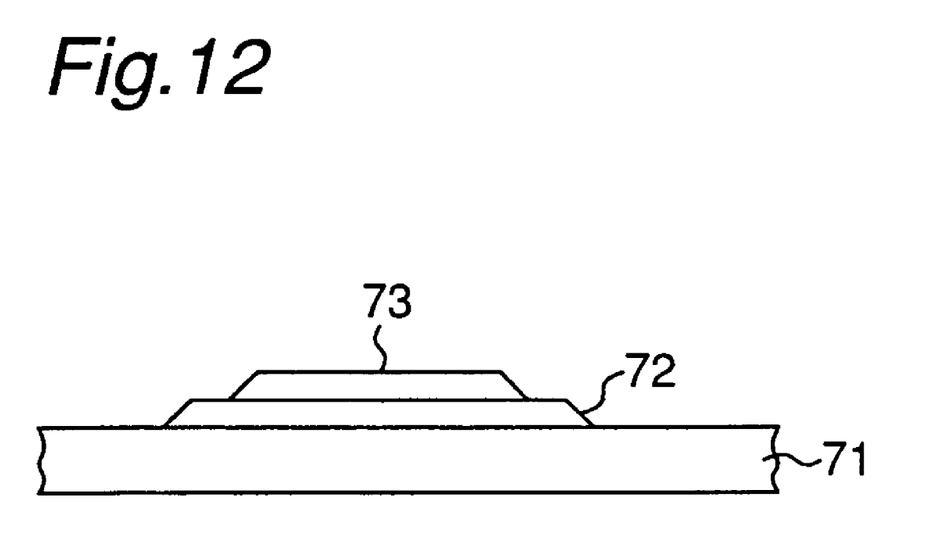
FIG. 12 is a partial sectional view of a patterned substrate of the present invention.

FIG. 12 is a partial sectional view of a patterned substrate of this embodiment. A numeral of 71 denotes a PET film. A numeral of 72 denotes an MoN wiring. A numeral of 73 denotes an Mo wiring. The patterned substrate constituted as described above is formed as described below.

First, the MoN film is formed on the PET film 71 under an atmosphere having a vacuum degree of 0.5 Pa with Ar gas at a flow rate of 100 sccm and N2 gas at a flow rate of 40 sccm. The Mo film is formed under an atmosphere having a vacuum degree of 0.5 Pa with Ar gas at a flow rate of 100 sccm with a thickness of about 1000 Å. Then, photolithography and etching are performed to pattern the MoN film and the Mo film into a prescribed circuit pattern. Thus, the MoN wiring 72 and the Mo wiring 73 are formed.

A two-layer structure of the MoN wiring 72 and the Mo wiring 73 is formed because sole use of only MoN wiring 72 results in high resistance and is impossible. It is noted that the N2 gas flow rate when the MoN film is formed in this embodiment is not limited to 40 sccm, but can be in the range between 20 sccm and 100 sccm inclusive as in the case of the first and second embodiments. Thus, the N2 content in the MoN film can be made between 5 atomic % and 30 atomic % inclusive. As a result, the MoN wiring 72 can obtain strong adhesion to the PET film 71 and the deterioration of the throughput of the patterning process can be prevented by preventing the decrease of the etching rate. Also, the MoN interconnect pattern formed on a polymeric film such as PET allows the film to be kept thin, light and flexible. Further, applications of the obtained patterned substrate are not particularly limited, but may be applied to the liquid crystal display of the first or second embodiment.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A liquid crystal display (LCD) comprising:
at least one thin film transistor (TFT), an interlayer insulator, and at least one reflective pixel electrode defining at least part of a pixel of the LCD and being supported by a substrate, wherein the interlayer insulator is located at least partially between the reflective pixel electrode and the substrate, and
a film comprising molybdenum nitride that is immediately below the reflective pixel electrode and contacting the reflective pixel electrode, wherein said film comprising molybdenum nitride is also above the interlayer insulator and contacting the interlayer insulator, so that the film comprising molybdenum nitride is at least partially between the reflective pixel electrode and the interlayer insulator and contacting each of the reflective pixel electrode and the interlayer insulator so that the bottom surface of the film comprising molybdenum nitride is above the top surface of the interlayer insulator and contacting the top surface of the interlayer insulator and the top surface of the film comprising molybdenum nitride is below the reflective pixel electrode and contacting the reflective pixel electrode.

2. The LCD according to claim 1, wherein the reflective pixel electrode comprises aluminum (Al).

3. The LCD according to claim 1, wherein the film comprising molybdenum nitride has a nitrogen content between 5 atomic % and 30 atomic %.

4. The LCD according to claim 1, wherein the interlayer insulator comprises a photosensitive resin.

5. The LCD according to claim 1, wherein the interlayer insulator comprises a polymeric resin.

6. The LCD of claim 1, wherein the pixel electrode is in electrical communication with a drain electrode of the TFT through a contact hole defined in the interlayer insulator, and wherein the reflective pixel electrode is above the film comprising molybdenum nitride and contacting the film comprising molybdenum nitride at least in areas not in said contact hole.

7. A liquid crystal display comprising:
a pair of substrates,
a liquid crystal layer between the pair of substrates,
a laminated layer provided on at least one of the substrates, wherein the laminated layer comprises an insulating film and a film comprising molybdenum nitride laminated to and over at least part of the insulating film, so that the film comprising molybdenum nitride contacts the upper surface of the insulating film; and
a reflective metal film having a light reflecting function and provided in at least one pixel region of the display for contributing to displaying of images in the display, wherein the reflective metal film is contacts the film comprising molybdenum nitride.

8. The liquid crystal display according to claim 7, wherein the film comprising molybdenum nitride has a nitrogen content between 5 atomic % and 30 atomic %.

9. The liquid crystal display according to claim 7, wherein the reflective metal film is a pixel electrode for applying a voltage to the liquid crystal layer.

10. The liquid crystal display according to claim 7, further comprising an electrode comprising indium-tin oxide (ITO) formed on the same substrate on which the reflective metal film is formed, wherein the film comprising molybdenum nitride is provided at least partially between the reflective metal film and the electrode comprising ITO.

11. The display of claim 7, wherein the reflective metal film is in electrical communication with a drain electrode of a TFF through a contact hole defined in the insulating film, and wherein the reflective metal film is above the film comprising molybdenum nitride and contacting the film comprising molybdenum nitride at least in areas not in said contact hole.

12. A liquid crystal display (LCD) comprising:
at least one thin film transistor (TFT),
an insulating layer at least partially provided over the TFT;
at least one reflective pixel electrode defining at least part of a pixel of the LCD; and
a film comprising molybdenum nitride in direct contact with the under-side of said reflective pixel electrode, such that the molybdenum nitride of said film comprising molybdenum nitride is in direct contact with both (a) the under-side of the reflective pixel electrode and
(b) the upper surface of the insulating layer.

13. The LCD of claim 12, wherein the pixel electrode is in electrical communication with a drain electrode of the TFT through a contact hole defined in the insulating layer, and wherein the pixel electrode is above the film comprising molybdenum nitride and contacting the film comprising molybdenum nitride at least in areas not in said contact hole.

* * * * *